US006941236B2

(12) United States Patent
Huelsbergen et al.

(10) Patent No.: US 6,941,236 B2
(45) Date of Patent: Sep. 6, 2005

(54) APPARATUS AND METHODS FOR ANALYZING GRAPHS

(75) Inventors: Lorenz Francis Huelsbergen, Hoboken, NJ (US); Oskar Mencer, Jersey City, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 127 days.

(21) Appl. No.: 10/400,904

(22) Filed: Mar. 31, 2003

(65) Prior Publication Data

US 2004/0204905 A1 Oct. 14, 2004

(51) Int. Cl.[7] ............................................. G06F 19/00
(52) U.S. Cl. ........................................ 702/66; 702/67
(58) Field of Search ...................... 702/66, 67; 716/4

(56) References Cited

U.S. PATENT DOCUMENTS

| | | | | |
|---|---|---|---|---|
| 5,377,201 A | * | 12/1994 | Chakradhar et al. | 714/741 |
| 5,521,591 A | * | 5/1996 | Arora et al. | 340/2.21 |
| 5,801,422 A | * | 9/1998 | Rostoker et al. | 257/369 |
| 6,105,018 A | * | 8/2000 | Demers et al. | 707/2 |
| 6,301,267 B1 | * | 10/2001 | Ben-Ami | 370/468 |
| 6,415,425 B1 | * | 7/2002 | Chaudhary et al. | 716/9 |
| 6,460,127 B1 | * | 10/2002 | Akerib | 712/10 |
| 6,536,018 B1 | * | 3/2003 | Chisholm et al. | 716/4 |
| 6,760,032 B1 | * | 7/2004 | James | 345/506 |
| 6,760,483 B1 | * | 7/2004 | Elichai et al. | 382/241 |
| 6,839,882 B2 | * | 1/2005 | McManus et al. | 716/1 |
| 2004/0090439 A1 | * | 5/2004 | Dillner | 345/440 |

FOREIGN PATENT DOCUMENTS

EP 001047008 A2 * 10/2000 ............ G06F/17/50

OTHER PUBLICATIONS

Babb et al., "Solving graph problems with dynamic computation structures," in High–Speed Comp, Digital Signal Processing, and Filtering Using Reconfigurable Logic, SPIE (The Int'l Society for Optical Eng.), 225–236 (1996).

Lorenz Huelsbergen, "Method and Apparatus for Configuring Dynamic Graph Processors," U.S. Appl. No. 09/295,252 filed Apr. 20, 1999.

Lorenz Huelsbergen, "A Representation for Dynamic Graphs in Reconfigurable Hardware and its Application to Fundamental Graph Algorithms," Proc. of the ACM Int. Symp. on Field Prog. Gate Arrays, 105–115 (2000).

Mencer, et al., "HAGAR: Efficient Multi–Context Graph Processors, " Conf. on Field Prog. Logic and App's, 915–924 (Sep. 2002).

* cited by examiner

Primary Examiner—Marc S. Hoff
Assistant Examiner—Anthony Gutierrez

(57) ABSTRACT

A plurality of hardware cells are defined, wherein at least a given one of the hardware cells corresponds to sets of vertices from a graph having vertices and edges interconnecting the vertices, and each of the sets are from a corresponding one of a number of portions of the graph. The given hardware cell is adapted to select one of the sets of vertices and to define for the selected set of vertices whether an edge exists in the graph between the vertices in the selected set. The hardware cells are used to analyze one or more properties of the graph, such as reachability or shortest path. The graph is mapped into an adjacency matrix, which contains a number of contexts, each context having a number of elements, and where the given hardware cell corresponds to multiple contexts of the adjacency matrix.

20 Claims, 7 Drawing Sheets

APPARATUS AND METHODS FOR ANALYZING GRAPHS

FIELD OF THE INVENTION

The present invention relates generally to graphs, and, more particularly, to graph analysis.

BACKGROUND OF THE INVENTION

A graph has a number of vertices interconnected through edges. Graphs are used to model a wide variety of systems and, consequently, have wide application. For example, one application of a graph is to describe computers and their interconnections on a computer network. Once a graph is used to describe a system, graph analysis may be performed to analyze the graph. Graph analysis is fundamental to many applications in computing, such as determining routing and layout in computer networks, determining routing and layout in very large scale integrated (VLSI) circuit computer-aided drafting (CAD), and determining relationships in computer graphics.

One conventional graph analysis method determines whether a destination vertex may be reached if one starts at a source vertex. This is called "reachability." Another conventional graph analysis method can determine one or more shortest paths between a source vertex and a destination vertex. This method is appropriately called "shortest path determination." The shortest path determination may also include determining reachability.

Software implementations of graph analysis methods usually involve "walking" the graph by following chains of pointers, or by repeatedly indexing into a two-dimensional array containing an adjacency matrix for the graph. The adjacency matrix is one technique used to describe the graph. A limiting factor for the performance of such software implementations is memory latency. Memory latency is recognized by the computer architecture community to be a major bottleneck that will become increasingly severe, particularly as processor speeds continue to increase faster than memory performance. See, for instance, Wulf et al., "Hitting the Memory Wall: Implications of the Obvious," Computer Architecture News, 23(1):20–24 (1995), the disclosure of which is hereby incorporated by reference.

The non-local and irregular memory accesses implied by following chains of pointers further diminish the effectiveness of caches introduced to mitigate processor and memory speed imbalance. This tends to slow memory accesses and, consequently, graph analysis. Furthermore, large graphs, such as graphs having thousands or tens of thousands of vertices, can use copious amounts of memory, processing power, and time for software implementations of graph analysis.

A need therefore exists for techniques that provide efficient graph analysis yet allow large graphs to be analyzed.

SUMMARY OF THE INVENTION

The present invention provides methods and apparatus for efficient graph analysis.

In an aspect of the invention, techniques are presented for analyzing a graph having a number of vertices and a number of edges interconnecting selected ones of the vertices. The techniques include defining a number of hardware cells, wherein at least a given one of the hardware cells corresponds to sets of vertices. Each of the sets are from a corresponding one of a number of portions of the graph. The given hardware cell is adapted to select one of the sets of vertices and to define for the selected set of vertices whether an edge exists in the graph between the vertices in the selected set. The hardware cells are used to analyze one or more properties of the graph, such as reachability from a source vertex, shortest path from a source vertex to a destination vertex, etc.

In another aspect of the invention, the graph is mapped into an adjacency matrix comprising a number of elements. At least the given hardware cell in the hardware array corresponds to a plurality of elements from the adjacency matrix. Each element in the adjacency matrix corresponds to a set of vertices of the graph and defines whether an edge exists between vertices in the set. A number of contexts for the adjacency matrix may be defined. Each context corresponds to one or more of the elements and to a portion of the graph. The given hardware cell therefore corresponds to multiple contexts.

In another aspect of the invention, the contexts may be changed and a context selected in order to cause the given hardware cell to select one of the sets of vertices corresponding to a selected context.

In yet another aspect of the invention, the given hardware cell corresponds to first and second interconnects, each first interconnect corresponding to one vertex from the graph and each second interconnect corresponding to another vertex in the graph, wherein the one vertex and the other vertex may or may not be the same vertex.

DETAILED DESCRIPTION

This disclosure describes, among other things, (1) a streamlined implementation of a graph representation that is performed through, for instance, tri-state logic and that can increase density and therefore graph size able to fit into an FPGA, (2) a scheme for scaling hardware arrays to larger graphs by splitting adjacency matrices into multiple contexts and having the hardware arrays able to switch between some or all of the multiple contexts, and (3) an embedding of graph analysis circuits in a module generation environment such as an FPGA generation environment.

Figure 1:
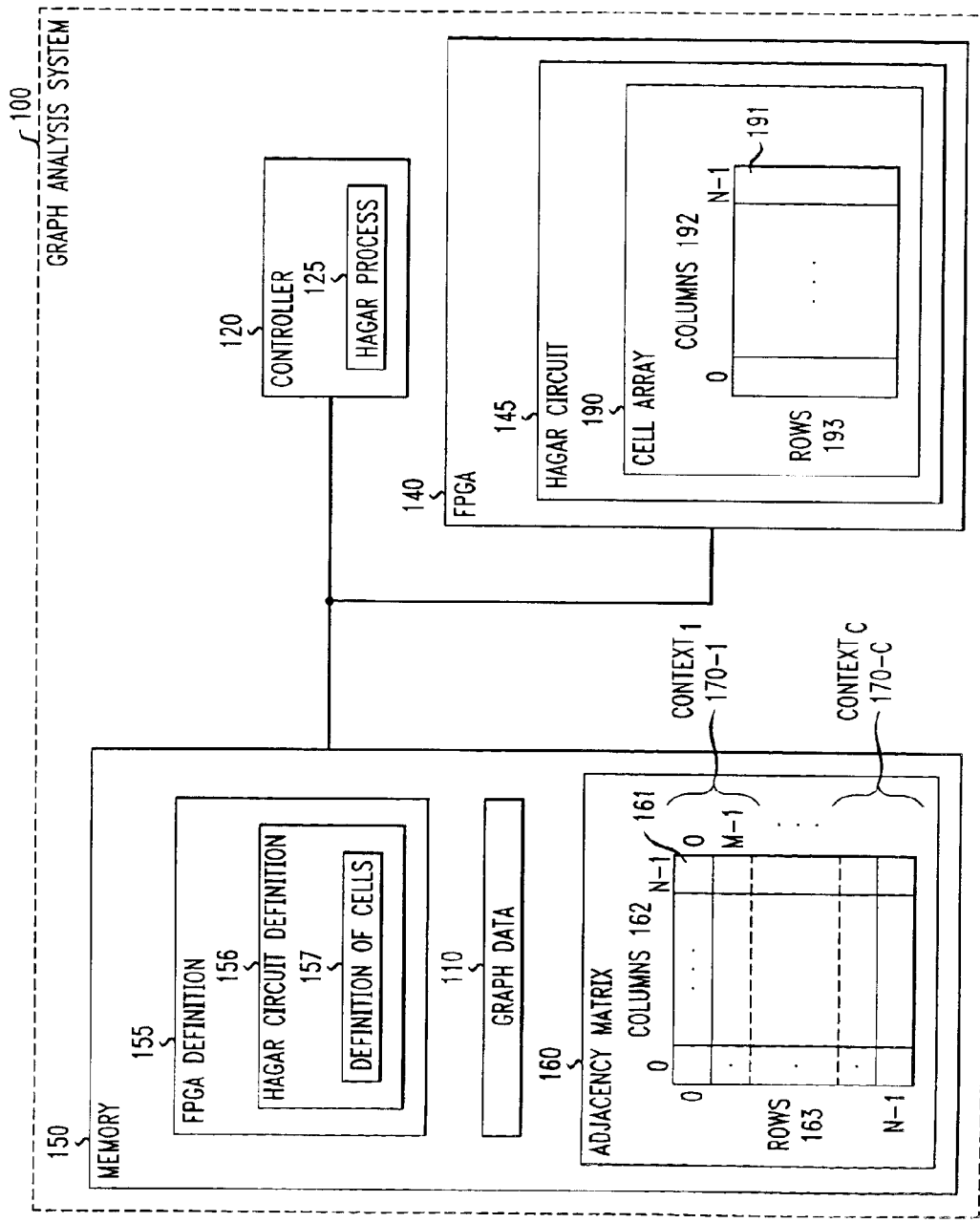
FIG. 1 is a block diagram of a graph analysis system in an illustrative embodiment of the present invention.

Turning now to FIG. 1, an exemplary graph analysis system 100 is shown, in accordance with a preferred embodiment of the invention. Graph analysis system 100 comprises a memory 150, a controller 120, and an FPGA 140. Memory 150 comprises an FPGA definition 155, graph data 110, and an adjacency matrix 160. FPGA definition 155 comprises HAGAR circuit definition 156 and a definition of cells 157. Adjacency matrix 160 comprises N columns 162 and N rows 163 of elements 161 and is, in this example, divided into C contexts 170-1 through 170-C (collectively, "contexts 170"). The controller 120 comprises a HAGAR process 125. The FPGA 140 comprises a HAGAR circuit 145, which comprises a cell array 190. Cell array 190 comprises a number of hardware cells 191, which are organized in this example into columns 192 and rows 193.

Graph data 110 describes one or more graphs, each graph G(V,E), defined as a set of N vertices V={$v_0, v_1, v_2, \ldots, v_{N-1}$}, and a set of edges, E, between the vertices. Illustratively, the graph data 110 may describe a directed graph, which has one edge between two vertices (e.g., an edge exiting vertex $v_0$ and entering vertex $v_1$), or an undirected graph, which can have two edges between two vertices (e.g., one edge exiting vertex $v_0$ and entering vertex $v_1$ and another edge exiting vertex $v_1$ and entering vertex $v_0$). The HAGAR process 125 takes graph data 110 as an input and produces adjacency matrix 160. The adjacency matrix 160 fully describes and is a representation of a particular instance of a graph, as described by graph data 110. The adjacency matrix 160 comprises a number of matrix elements 161. A matrix element 161, which may be denoted as a(i, j), will be assigned the value of one (i.e., a(i, j)=1) if and only if there is an edge from vertex $v_i$ to $v_j$; otherwise a(i, j)=0. The adjacency matrix 160 has N=|V| rows and columns and thus, in this example, the adjacency matrix 160 has a size of $O(N^2)$.

Figure 3:
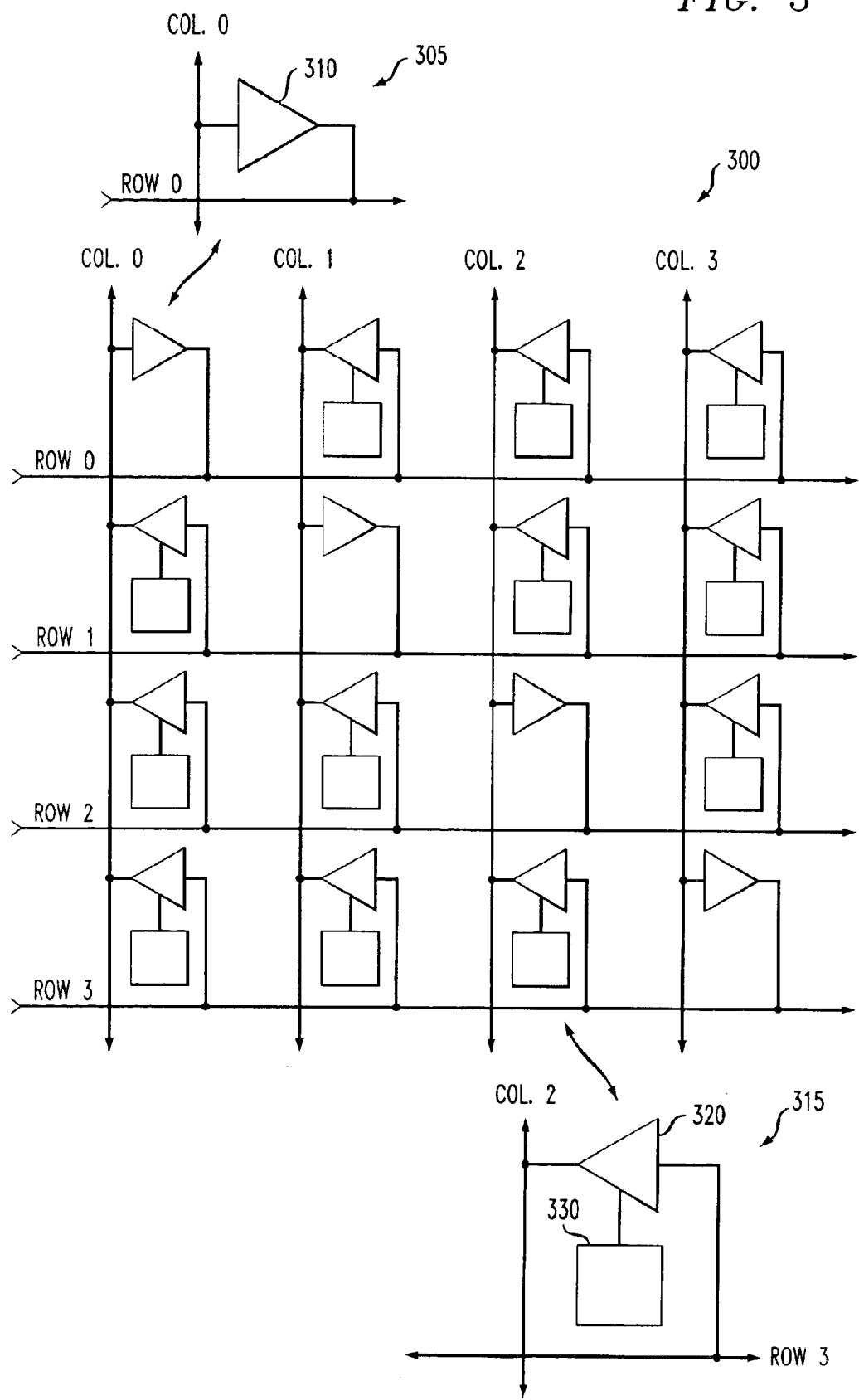
FIG. 3 is a portion of a cell array used to represent an adjacency matrix.

The HAGAR process 125 can map the adjacency matrix 160 into the definition of cells 157. Each hardware cell 191, as described in more detail below in reference to FIG. 3, is a representation of one or more elements 161, and each hardware cell 191 defines whether there is an edge from $v_i$ to $v_j$ for the one or more elements 161. Each hardware cell 191 therefore corresponds to one or more sets of cells from different portions of a graph as defined by the graph data 110. Each hardware cell 191 is any hardware device used for computing or in switching technology, such as all electronic types of hardware (including reconfigurable hardware and FPGAs) as well as any other type of physical substrate, such as optical switches. The HAGAR process 125, also can create the HAGAR circuit definition 156. The HAGAR circuit definition 156 comprises instructions (not shown) suitable for creating HAGAR circuit 145. The HAGAR circuit 145 is a circuit that can analyze graphs through techniques that are, for instance, efficient in both analysis time and the amount of FPGA space used to hold a representation of a graph. The analysis can analyze one or more graph properties of a graph, as described by graph data 110. Part of the HAGAR circuit definition 156 is the definition of cells 157. The definition of cells 157 comprises instructions (not shown) suitable for creating cell array 190. Exemplary hardware cells 191 are shown in reference to FIGS. 3 and 4 below. The HAGAR process 125 will generally create additional logic (not shown in FIG. 1) used during analysis of graphs. This logic is illustratively shown in FIGS. 4 and 6 and uses the cell array 190 in order, for example, to determine one or more graph properties of graph 110.

As described in more detail below, a single row 193 of cell array 190 can be mapped to multiple rows 163 of the adjacency matrix 160. There may be a single row 193 or multiple rows 193. In an exemplary embodiment described below, a single row 193 corresponds to multiple rows 163 and there are a number of rows 193. In another exemplary embodiment described below, there is a single row 193 that corresponds to the N rows of the adjacency matrix 160.

It should be noted that the number of columns 192 in the cell array 190 need not be the same as the number of columns 162 in the adjacency matrix 160. For ease of illustration, the examples given herein will assume that the number of columns 192 in the cell array 190 are the number of columns 162 in the adjacency matrix 160. However, numbers of the two columns 162, 192 are the same only for the sake of exposition and there is no requirement that the two columns 162, 192 have the same numbers of columns.

The controller 120 can be any type of device suitable for loading the FPGA definition 155 into the FPGA 140. Consequently, the controller 120 can be a microprocessor in a computer system, the memory 150 can be memory of a computer system, and the asynchronous transfer network 140 can be contained on a card placed into the computer system. Illustratively, the controller 120 may also be another FPGA, a digital signal processor, or a microcontroller. Memory 150 may be any memory suitable for containing information and can be read-only or read-write memory, and removable memory such as a memory stick or other machine recordable medium.

It should be noted that the implementation technology for a HAGAR circuit 145 and its hardware cells need not only be FPGAs but could also be custom circuits such as application specific integrated circuits (ASICs) or optical systems.

It should also be noted that the FPGA definition 155 may be determined such that the HAGAR process 125 can simply load the FPGA definition 155 into the FPGA 140. The determination of FPGA definition 155 may be performed by HAGAR process 125 and the FPGA definition 155 stored for subsequent loading into the FPGA 140. The determination of FPGA definition 155 may also be performed by a system separate from graph analysis system 100, if desired.

The cell array 190 can be changed if the graph 110 changes. In this instance, it is possible for the HAGAR process 125 to determine the cell array 190 during real time, if desired, and there may not be a need for a definition of cells 157. In other words, the HAGAR process 125 can create the cell array 190 directly from the adjacency matrix 160. Moreover, because the adjacency matrix 160 defines an instance of a graph 110, the graph 110 may not be needed once the adjacency matrix 160 is created. Changes to the graph 110 can be recreated by directly changing the adjacency matrix 160. Additionally, there may be multiple FPGA definitions 155, if desired. For example, each of the HAGAR circuits described below in reference to FIGS. 4 and 6 can be described by an individual FPGA definition 155, and the HAGAR circuit 145 can be changed between the two FPGA definitions 155.

The techniques discussed herein may be implemented as an article of manufacture comprising a machine-readable medium, as part of memory 150 for example, containing one or more programs which when executed implement embodiments of the present invention. For instance, the machine-readable medium may contain a program configured to perform some or all of the steps of HAGAR process 125. The machine-readable medium may be, for instance, a recordable medium such as a hard drive, an optical or magnetic disk, an electronic memory, or other storage device.

Figure 2:
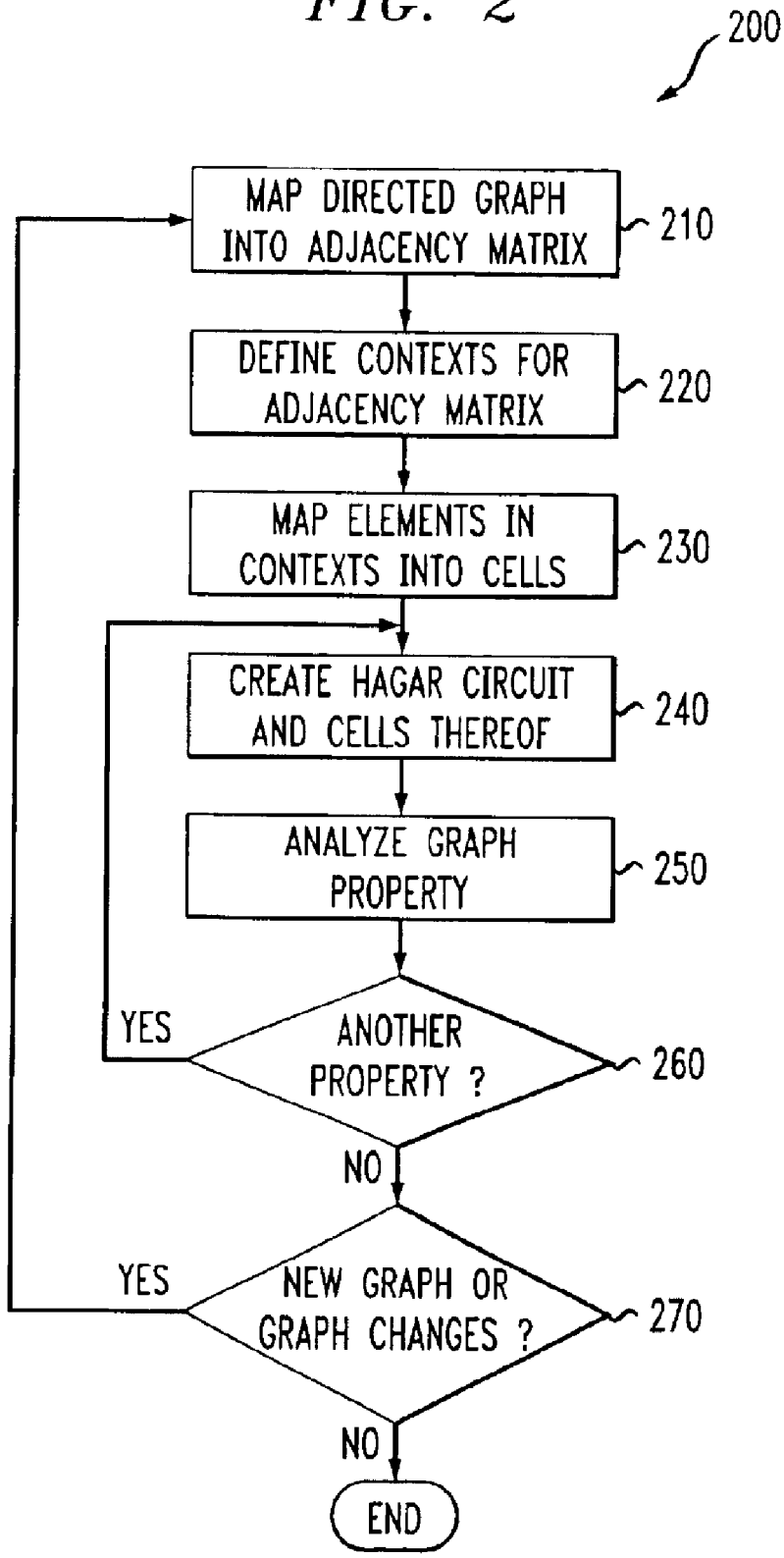
FIG. 2 is a flowchart of a method for analyzing a number of graphs.

Referring now to FIG. 2 (with appropriate reference to FIG. 1 when necessary), a method 200 is shown for analyzing a number of graphs, in accordance with a preferred embodiment of the invention. Method 200 is generally performed by HAGAR process 125 whenever one or more graphs are to be analyzed.

Method 200 begins in step 210 when a graph, described in graph data 110, is mapped into an adjacency matrix 160. Some exemplary techniques for mapping graph data 110 into an adjacency matrix 160 are described in L. Huelsbergen, "A Representation for Dynamic Graphs in Reconfigurable Hardware and its Application to Fundamental Graph Algorithms," which has already been incorporated by reference above. In step 220, one or more contexts 170 are generally defined for the adjacency matrix. As described below, graph data 110 may be large enough to fit into single or multiple contexts 170 for an adjacency matrix 160 and may be analyzed through techniques of the present invention. A context 170, as previously described, is a portion of an adjacency matrix 160, which defines an instance of a graph data 110. Certain aspects of the present invention allow large adjacency matrices 160 to be analyzed by portioning the adjacency matrix 160 into multiple contexts 170 in order to be able to create a HAGAR circuit 145 that can analyze the multiple contexts 170.

Consider a HAGAR circuit 145 for N vertices $V=\{v_0, v_1, v_2, \ldots, v_{N-1}\}$ in a graph, described by graph data 110, and a corresponding number of elements 161 in an adjacency matrix 160. If there are M rows per context 170, then there are C=N/M contexts 170 in the adjacency matrix 160. Context 0 comprises the first M rows of the adjacency matrix 160, context 1 holds the second set of M rows, etc. Then the elements 161 in the C contexts 170 are mapped to hardware cells in the HAGAR circuit 145 and its cell array 190 in step 230. As described in more detail below, each hardware cell 191 in the cell array 190 can correspond to multiple elements 161 from multiple contexts 170. Each hardware cell 191 can easily select another context 170. When a context is selected, a hardware cell 191 defines whether there is an edge between a set of vertices in a graph, defined by graph data 110, and whether a corresponding element 161 in adjacency matrix 160 is a zero (e.g., no edge exists between two vertices) or a one (e.g., an edge exists between the two vertices). Exemplary cells 191 suitable for switching between contexts 170 are shown below.

Figure 4:
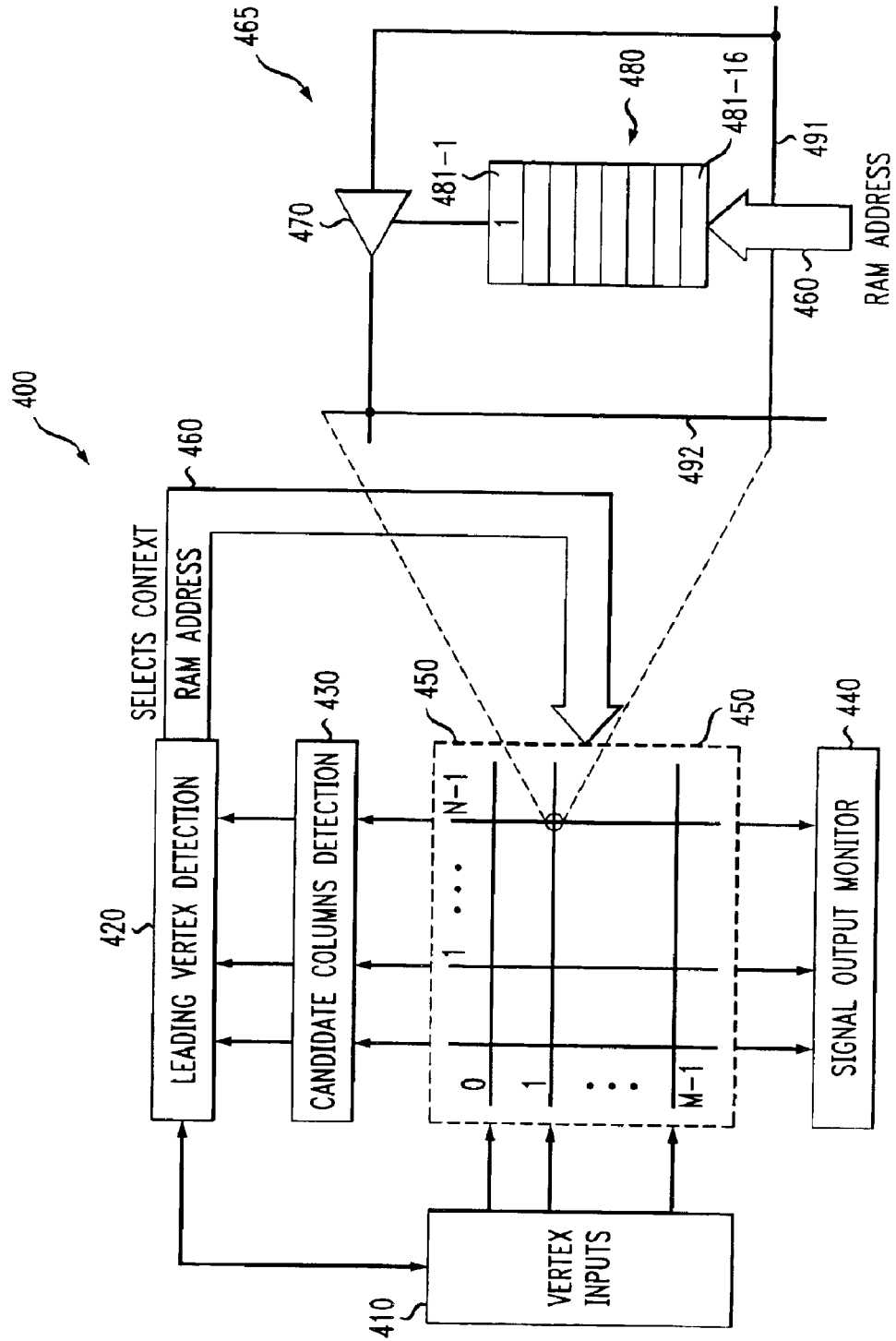
FIG. 4 is a block diagram of a HArdware Graph ARray (HAGAR) circuit for determining reachability for graphs.
Figure 5:
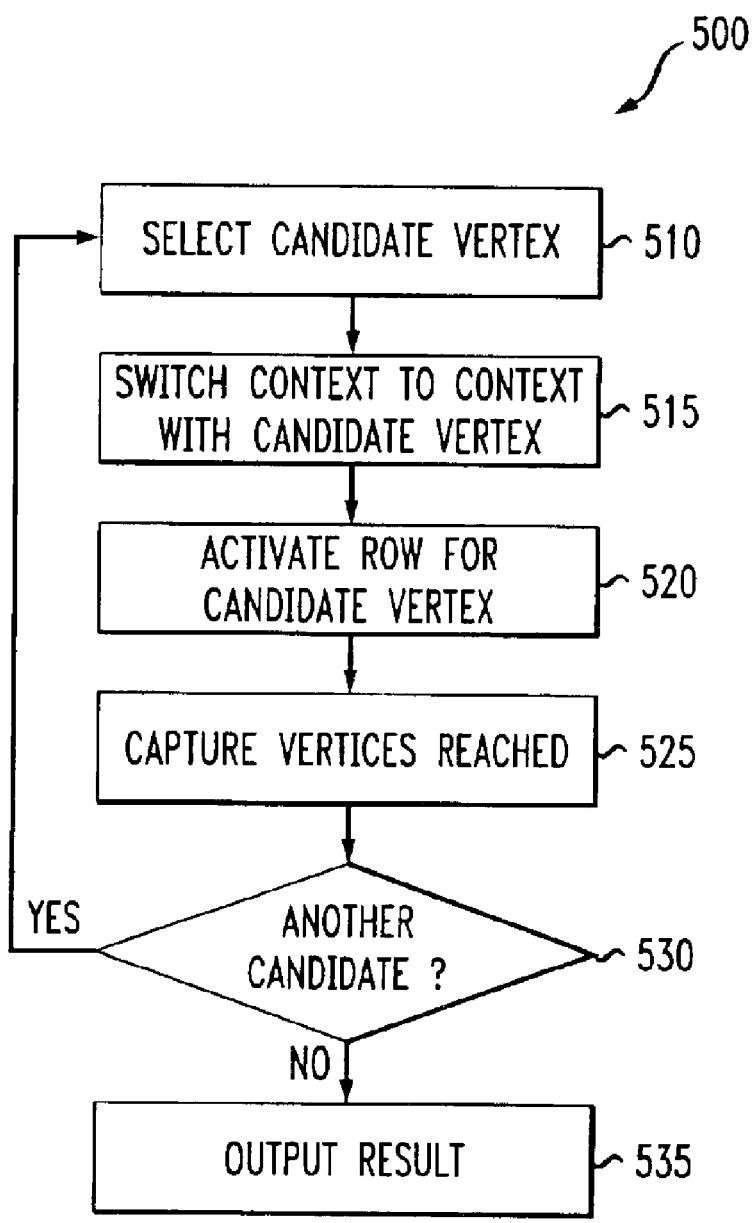
FIG. 5 is a flowchart of a method for determining reachability for graphs.

In step 240, the HAGAR circuit 145 and its associated cell array 190 is created. Generally, this step is completed by having the HAGAR process 125 load the FPGA definition 155, including the HAGAR circuit definition 156, into the FPGA 140. Step 240 generally entails creating an appropriate HAGAR circuit 145 for the particular graph property to be analyzed. In step 250, a graph property is analyzed. FIGS. 4 and 5 describe a HAGAR circuit 145 and a method for determining reachability in a graph, and FIGS. 6 and 7 describe a HAGAR circuit 145 and a method for determining shortest path in a graph.

In step 260, it is determined whether another property is to be analyzed for the currently selected graph. If another property is to be analyzed (step 260=YES), method 200 continues in step 240. If another property is not going to be analyzed (step 260=NO), method 200 continues in step 270. In step 270, it is determined if there is a new graph to analyze or whether a change to the current graph data 110 has occurred. If so (step 270=YES), method 200 continues again in step 210.

It should be noted that when a change to a graph has occurred, such as through a change to graph data 110, it may be possible to continue method 200 in steps other than step 210. For instance, a single removal of an edge between two vertices may be accomplished by a removal of or a modification to a single cell when there is a single context adjacency matrix 160 in the HAGAR circuit 145. The removal or modification could be performed in step 240, for instance.

Turning now to FIG. 3, a portion 300 of a cell array, such as cell array 190, is shown. Portion 300 is suitable for representing a portion of an adjacency matrix 160. Portion 300 comprises three rows and three columns. Each row and column corresponds to a vertex from a graph. Portion 300 comprises 16 cells. At each location where the column and row numbers are the same, a hardware cell 305 comprises a driver 310 that couples the columns and rows together. For example, a hardware cell 305 comprises a driver 310 that couples column 0 to row 0. Each hardware cell 305 corresponds to a set of vertices, which correspond to a column and a row. For each hardware cell 305, the set of vertices includes one vertex.

At each location where the column and row numbers are different, a hardware cell 315 comprises a tri-state buffer 320 and a memory element 330. Each hardware cell 315 corresponds to a set of vertices, as each column and row corresponds to a vertex. For each hardware cell 315, the set of vertices for the cell includes two different vertices. The tri-state buffer 320 couples or uncouples its respective column and row, depending on the state of memory element 330. If the memory element 330 is a first state (such as a one), the tri-state buffer 320 drives current onto its respective column, thereby coupling its respective row and column together. When the memory element 330 is a second state (such as a zero), the tri-state buffer 320 decouples its respective row and column by floating its output. For example, a tri-state buffer 320 can couple row 3 to column 2. When the memory element 330 corresponding to this tri-state buffer 320 is a one, the tri-state buffer 320 drives current onto column 2, thereby coupling row 3 and column 2; when the memory element 330 corresponding to this tri-state buffer 320 is a zero, the tri-state buffer 320 floats its output high, thereby decoupling row 3 from column 2. The memory elements 330 may be a flip flop or other memory device. The memory element 330 connected to a tri-state buffer 330 stores an entry of the adjacency matrix 160 and determines whether or not the row signal is forwarded to the column.

The approach shown in FIG. 3 may be implemented by, for instance, the Xilinx XC4000 and Virtex families of FPGAs. The use of tri-state buffers more compactly implements desired functionality. A compact implementation can hold larger graphs and operate more quickly.

It is apparent from FIG. 3 that an FPGA of a fixed size usually can only hold representations of graphs up to a fixed number of vertices. Although the FPGA size places an upper bound on the number of vertices, the number and location of the edges of the graph is unbounded in the approach used herein. Inserting an edge into the graph generally comprises writing a '1' to the memory element 330 at a position in a cell array. The position is demarcated as a (source, destination) such as (vertex $v_0$, vertex $v_1$), which corresponds, for example, to (row 0, column 1). The position corresponds to an element in an adjacency matrix.

Notice that the cells 305 along the diagonal differ from the other cells 315 in the array. This difference in cell structure implements the propagation of a value of a vertex onto its edges and is beneficial when the cell array is used to evaluate a graph property such as reachability, described below.

As a starting point, the design illustrated in FIG. 3 may be used to implement a graph with a small number of nodes so that the entire adjacency matrix fits into one FPGA. Reachability is a graph primitive from which many graph algorithms, such as transitive closure and connected components, may be constructed. Reachability takes as input a source vertex and a destination vertex and decides if there is a path from the source vertex to the destination vertex. In other words, if the destination vertex is reachable from the source vertex.

The structure proposed in FIG. 3 may be used to compute reachability for single context adjacency matrices as follows. After the adjacency matrix is loaded into the memory elements 330 in the cells 315, it suffices to drive a value of '1' (for example) onto a row corresponding to a source node and to observe the row of the destination node. In fact, all rows corresponding to nodes that are reachable from the source node will be driven high ('1'), for instance, within the time it takes the signal to propagate through the cell array. Thus, the performance of computing reachability is converted to the propagation delay of a combinational circuit.

Since the size of an adjacency matrix grows quadratically with the maximum number of vertices, the size of the FPGA limits the absolute size of a representation of a graph. HAGAR circuits may beneficially address this problem by partitioning the adjacency matrix, which describes an instance of a graph, into contexts. During evaluation of a graph property, HAGAR circuits switch between these contexts in an orchestrated fashion to obtain the desired result. Ideally, context switches should be as fast as possible.

While multiple FPGA configurations could be used as contexts, certain aspects of the present invention implement a cell array, suitable for defining and switching between multiple contexts, within the FPGA by using, for example, the FPGA's configurable logic blocks (CLBs) as memory elements for determining and switching between contexts. A four-input lookup table (LUT), for instance, has 16 bits of storage and can therefore store up to 16 indicators of contexts.

Turning now to FIG. 4, an exemplary HAGAR circuit 400 is shown for determining reachability for graphs. HAGAR circuit 400 comprises a vertex inputs module 410, a leading vertex detector module 420, a candidate columns detection module 430, a signal output monitor module 440, a cell array 450 comprising a number of cells 465, and a random access memory (RAM) address 460. Each hardware cell 465 comprises a tri-state buffer 470 and a four-input LUT 480 and is coupled to a row (e.g., interconnect 491) and a column (e.g., interconnect 492). Each column and row corresponds to a vertex. Four-input LUT 480 comprises a number of memory elements 481-1 through 481-16 (collectively, memory elements 481). Each hardware cell 465 corresponds to 16 sets of vertices from 16 contexts, where each set of vertices is defined by the column and row.

As described previously, consider a HAGAR circuit 400 for N vertices V={$v_0, v_1, v_2, \ldots, v_{N-1}$}. M rows per context gives C=N/M contexts. Context 0 consists of the first M rows of the HAGAR, context 1 holds the second set of M rows, etc. In this example, each context comprises M rows and N columns, as shown in FIG. 4. The C contexts are stored in the memory elements 481. Each memory element 481-1 through 481-16 determines a state of the tri-state buffer 470 for a particular context. For example, the '1' stored in memory element 481 will cause the tri-state buffer 470 to drive current onto column (N−1), which couples row 1 with column (N−1) and indicates that an edge exists between vertices corresponding to row 1 and column (N−1). A '0' stored in memory element 481 will cause the tri-state buffer 470 to "float" its output to an intermediate value, which decouples row 1 and column (N−1) and indicates that there is no edge between vertices corresponding to row 1 and column (N−1). It should be noted that a row and column each corresponding to the same vertex will have a value in a memory element 481, associated with the current context, that causes the tri-state buffer 470 to couple the row and column. The RAM address 460, which may be driven via a bus (not shown) acts like a pointer and changes each hardware cell 465 to point to a selected memory element 481.

During a context switch, column values will stay unchanged. At every column, the candidate columns detection module 430, at the top of the cell array 450, detects columns with values of '1' and retains the column value. Once a column receives a signal and becomes high, the column remains high during the entire evaluation, which in general comprises multiple context switches. The candidate columns detection module 430 detects which sets of vertices have edges connecting the vertices, which in the example of FIG. 4 is indicated by having a column corresponding to the set of vertices become a '1'.

The leading vertex detector module 420 is used to determine which vertices have already been examined, which vertices have yet to be examined, which vertex should be selected as a candidate vertex, and to select an appropriate RAM address 460 in order to select a context corresponding to the selected candidate vertex. The leading vertex detector module 420 receives candidate vertices from the candidate columns detection module 430 and determines which candidate vertices should be selected. The vertex inputs module 410 drives rows corresponding to vertices being examined high, and receives input from the leading vertex detector module 420. For instance, assume one wants to compute the vertices reachable from vertex $v_0$ (e.g., implemented in row 0 of context 0 and column 0 in this example). The RAM address 460 is switched to point to context 0, and the vertex input module 410 drives a '1' on row 0.

Suppose column M+2 and 2M+4 become '1'. At the next clock cycle, the current context will be swapped for another. This occurs by changing the RAM address 460. Additionally, the vertex inputs module 410 will receive a candidate row, corresponding to a selected candidate vertex, from leading vertex detector module 420. Selected candidate vertices for swapping-in are those columns (e.g., corresponding to vertices) that have received a '1' signal but have not yet been checked. The column corresponding to vertex $v_0$ has signal '1' but the vertex has been checked. The columns corresponding to vertices $v_{(M+2)}$ and $v_{(2M+4)}$ now become candidates. The leading vertex detector module 420 picks the first candidate, determines an appropriate context for the candidate vertex, and switches to the appropriate context. In this example, the vertex $v_{(M+2)}$ corresponds to context 1. Illustratively, the leading vertex detector module 420 picks vertex $v_{(M+2)}$, determines that context 1 is the appropriate context for the candidate vertex, and switches to context 1 by outputting an appropriate RAM address 460. The leading vertex detector 420 directs the vertex inputs module 410 to drive a row corresponding to vertex $v_{(M+2)}$ high. In this example, the vertex inputs module 410 drives row 1 high.

During another clock cycle, the leading vertex detector module 420 selects vertex $v_{(2M+4)}$, determines the context for this vertex is context 2, switches to context 2 by outputting an appropriate address on RAM address 460, and directs the vertex inputs module 410 to drive a row corresponding to vertex $v_{(2M+4)}$ in context 2 (e.g., row 3) high. When there are no more unchecked candidate vertices, the computation is done. By monitoring column outputs, the set of vertices reachable from vertex $v_0$ comprises the vertices with column values of '1', which are contained in signal output monitor 440.

In this example, the signal output monitor module 440 has N bits corresponding to the N vertices in a graph. Each clock cycle, the signal output monitor module captures which columns that are high. A read out of the N bits in the signal output monitor module 440 determines which vertices were reached during the reachability technique.

Referring now to FIG. 5, a method 500 is shown for determining reachability for graphs, in accordance with a preferred embodiment of the invention. Method 500 is performed by, for instance, HAGAR circuit 400 (see FIG. 4) and corresponds to step 250 of FIG. 2.

Method 500 begins in step 510, When a candidate vertex is selected. Generally, the first candidate vertex is preselected via the controller 120 (see FIG. 1) by a user. Additional contexts are selected, for instance, by the leading vertex detector module 420. In step 515, the context is switched to a selected context with the candidate vertex. This usually is performed by switching the RAM address 460 to an appropriate address for the selected context and having each of the cells 465 define, through tri-state buffers 470, whether or not edges exist between a vertex (e.g., corresponding to a column) and another vertex (e.g., corresponding to a row). In step 520, the row is activated for the candidate vertex. Generally, this comprises having the vertex inputs module 410 drive an appropriate row, corresponding to the candidate vertex in the selected context, high. In step 525, the vertices that are reached are captured. This occurs by having the signal output monitor module 440 and the candidate columns detection module 430 capture which columns are driven high. In step 530, it is determined whether there is an additional candidate vertex. If so (step 530=YES), the method 500 continues in step 510, when the leading vertex detector 420 selects another candidate vertex. If not (step 530=NO), the method 500 ends in step 535 when the result is output. In this example, the result is the output of signal output monitor module 440, which contains bits corresponding to columns. The bits that are high, for instance, indicate which vertices were reached.

Another graph property is shortest path. An implementation of determining shortest path via a HAGAR circuit is slightly more complex than a reachability implementation. There are well known software solutions for determining shortest path, some of which are described in, for instance, T. H. Cormen, et al., "Introduction to Algorithms," MIT Press, 1990, the disclosure of which is hereby incorporated by reference. Determining shortest path takes two input vertices, a source vertex and a destination vertex. From the set of paths from the source vertex to the destination vertex, a shortest such path is a result; otherwise, the technique may indicate that no path exists from the source vertex to the destination vertex.

To find the shortest path, it is beneficial to use a particular version of the HAGAR cell array. This version has contexts being single rows (M=1) of the original square (e.g., an N×N) adjacency matrix. Contexts still contain N columns, where N is the number of vertices in the graph. There are therefore C=N contexts stored in the memory elements associated with a single cell in the HAGAR cell array. The contexts are named, for instance, context 0 to context (N−1).

Figure 6:
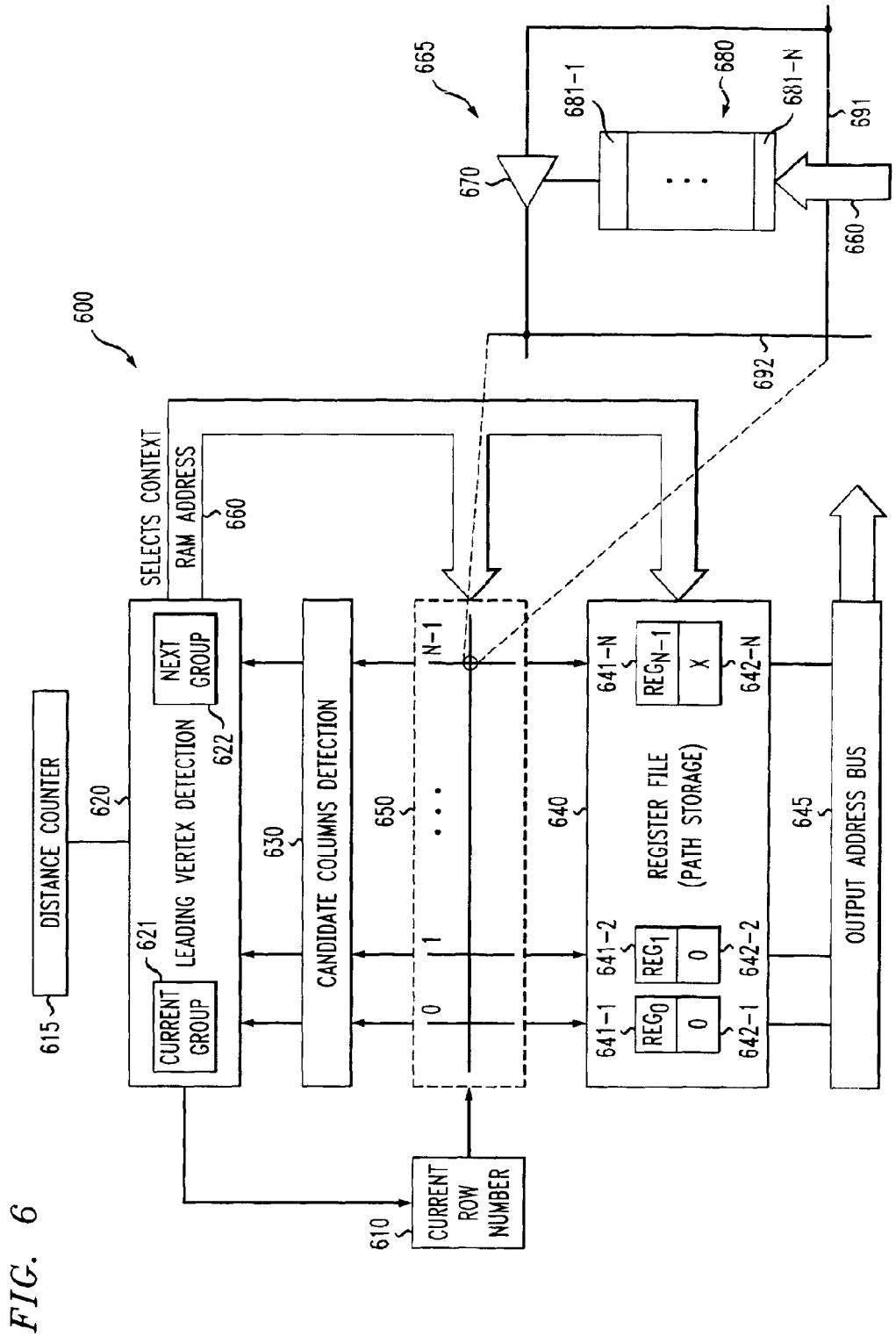
FIG. 6 is a block diagram of a HAGAR circuit for determining a shortest path for graphs.

Turning now to FIG. 6, an exemplary HAGAR circuit 600 is illustrated for determining shortest path in a graph. HAGAR circuit 600 comprises a context row number module 610, a distance counter 615, a leading vertex detector module 620, a candidate columns detection module 630, a register file module 640, an output address bus 645, a HAGAR cell array 650, and a RAM address 660. An exemplary hardware cell 665 is also shown in FIG. 6. The leading vertex detection module 620 comprises a current group 621 and a next group 622. The register file module 640 comprises N registers, registers 641-1 through 641-N. Each register 641 comprises a value 642. Each value 642 indicates in what context, if ever, the column became high, which indicates that there is an edge from the column to the row for the recorded context. For example, if vertex $v_0$ is the source vertex, it became high in context 0 (see value 642-1) as did vertex $v_1$ (see value 642-2). The value 642-N of "X" in vertex $v_{N-1}$ indicates that this vertex was never reached. The value "X" can be any suitable value, such as minus one for instance. The RAM address 660 is used as an input into the register file module 640 so that the register file module 640 can record the current context, which is indicated by the RAM address 660.

Hardware cell 665 comprises a tri-state buffer 670 and a RAM portion 680 comprising N memory elements 681-1 through 681-N. RAM portion 680 may be a register or any other addressable memory. Tri-state buffer 670 can drive current onto a respective column (e.g., interconnect 692), such as column (N−1), which couples row 0 (e.g., interconnect 691) with the respective column. Each column and row corresponds to a vertex, such that a hardware cell 665 corresponds to N sets of vertices from N contexts. The tri-state buffer 670 can also decouple the row 0 from a respective column. The memory elements 681 each contain a value defining whether two vertices are interconnected through an edge. If two vertices are interconnected through an edge, then tri-state buffer 670 will drive current onto a respective column, thereby coupling the row and the respective column. If the two vertices are not interconnected through an edge, then the row and the column that corresponds to the tri-state buffer 670 will be decoupled. It should be noted that a column and row corresponding to the same vertex will have a value in the memory element 681, associated with the current context, that causes the tri-state buffer 670 to couple the row and column. For example, when the row is vertex $v_0$, there will be a column that corresponds to vertex $v_0$ (e.g., column 0). The hardware cell 665 corresponding to the column 0 will have a memory element (e.g., 681-1) having a value of '1'. The value of '1' will cause the tri-state buffer 670 to couple row 0 and column 0.

The leading vertex detection module 620 operates to determine candidate vertices and to select a vertex to use for another cycle. The leading vertex detection module directs the current row number module 610 as to which vertex should be selected. The row is driven to a particular value (such as a high value) by the current row number module 610. The candidate columns detection 630 operates to determine which column is high and to keep the columns as driven high for a cycle.

An explanation of HAGAR circuit 600 is best presented through an exemplary shortest path determination. A shortest path determination starts with the source vertex, say vertex $v_0$. The computation ends when the destination vertex, say vertex $V_7$, is reached or when no progress is made. In the example of FIG. 6, each vertex corresponds to a context. Values corresponding to the contexts are loaded into the memory elements 481. If column 7 changes from '0' to '1', which means vertex $v_7$ is reached, the shortest path is available in the register file module 640 and the output address bus 645 may be used to read out the shortest path.

The register file module 640 holds vertices in traversed paths. For each column i (where i is between 0 and N−1 in this example) the register file module 640 keeps the log(N) bits that identify the vertex that immediately precedes column i on the shortest path. For example, if column 8 goes from '0' to '1' during a cycle, this means that vertex v8 is reached. If the current context (e.g., as determined by the leading vertex detection module 620 and the current row number module 610) is 11, vertex v8 is reached via vertex v11. The register file module 640 can hold, for example, an "11" for column 8.

The distance counter 615 is used to count how many steps away from the source vertex the shortest path determination is currently. At each step k there is a group of vertices that needs to be checked. This group of vertices contains the vertices that can be reached from the source vertex in a minimum of k steps. This group of vertices is contained in the leading vertex detection module 620 in the current group 621. After all vertices have been checked for a step, the distance counter 615 is increased by one. The leading vertex detection then determines the next group 622, which is the next set of vertices corresponding to the next step.

For example, assume that the vertex v0 is taken as the source vertex and has edges to vertices $v_1$, $v_5$, and $v_9$. The vertex group $\{v_1, v_5, v_9\}$ is therefore determined during step one, which corresponds to a distance of one. The context is selected by using the RAM address to select the appropriate memory element 681. When the current row number module 610 drives vertex $v_0$ onto the row, columns 1, 5, and 9 should be driven high. These columns are stored in the candidate columns detection module 630, and transferred to the leading vertex detection module 620, which stores the vertices as current group 621. The leading vertex detection module 620 will then select one of the vertices from the current group 621. Assume the following: from vertex $v_1$, vertex $v_3$ can be reached; from vertex $V_5$, the vertices $v_{12}$ and $V_{14}$ can be reached; and from vertex $v_9$, vertices $v_3$ and $v_4$ can be reached. Whenever a vertex is driven high by the current row number module 610, the candidate columns detection module will determine that a column is high and the leading vertex detection module 620 can add this column (if not previously added) to the next group 622. By doing this, once the current group 621 has been examined, then vertices $v_3$, $v_4$, $v_{12}$, and $v_{14}$ now form the next group 622 that needs to be checked in step two. The leading vertex detection module 620 then makes the next group 622 the current group 621.

Figure 7:
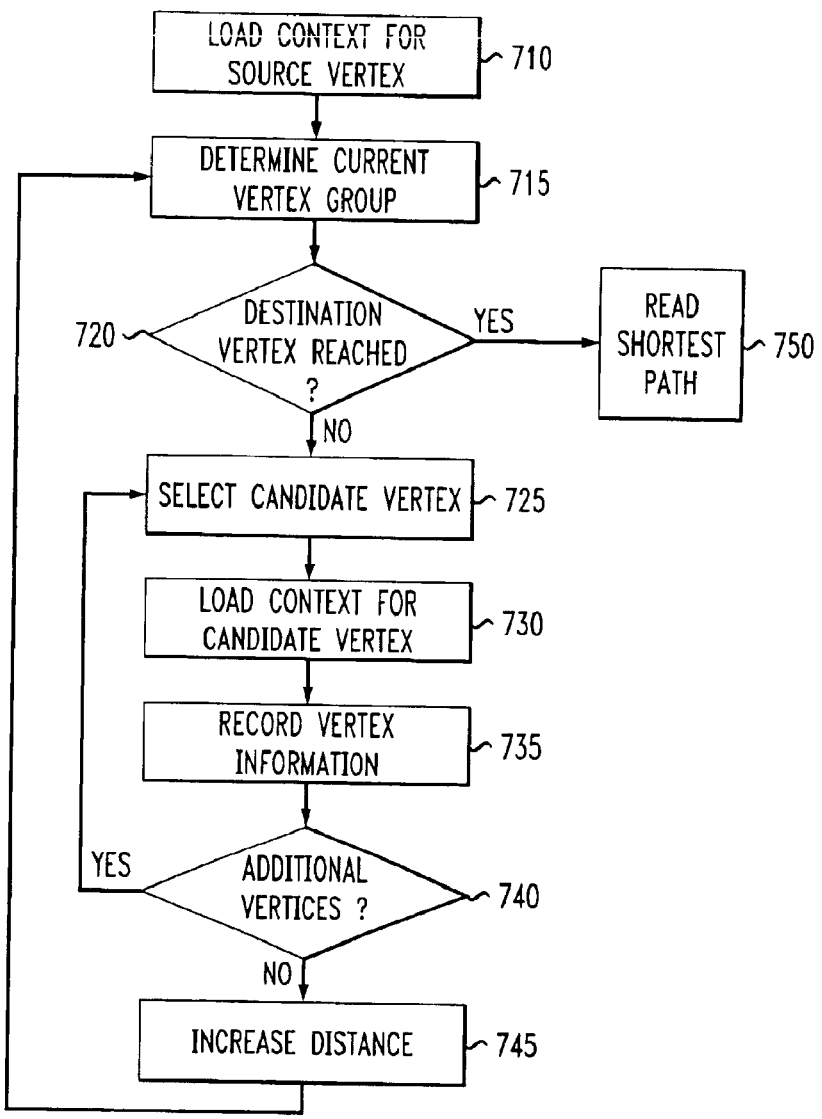
FIG. 7 is a flowchart of a method for determining a shortest path for graphs.

Turning now to FIG. 7 with appropriate reference to FIG. 6, an exemplary method 700 is shown for determining a shortest path in a graph, in accordance with a preferred embodiment of the invention. Method 700 is performed, for instance, by the HAGAR circuit 600 of FIG. 6, and corresponds to step 250 of FIG. 2.

Method 700 begins in step 710 when context is loaded for a source vertex. The source vertex may be chosen by a user or by a controller 120 (see FIG. 1) for example. Loading the context may be performed by changing each of the RAM portions 680 to an appropriate memory element 681 corresponding to the context. The appropriate memory element 681 for a hardware cell 665 defines a state of tri-state buffer 670, which then defines whether vertices in a set are interconnected through an edge. In step 715, a current vertex group 621 is determined. The current vertex group 621 is determined by driving the row high for the source vertex. Each vertex in column 0 through column (N−1) will then be driven high when there is an edge between the source vertex and one of the (N−1) vertices (e.g., including the source vertex itself) in the current context. In the examples of FIGS. 6 and 7, the current context corresponds to the vertex being driven on the row by the current row number module 610. In this example, vertex information is also recorded in the register file module 640 in step 715. The vertex information comprises a value indicating in which context a column becomes a particular value. For example, when column 1 becomes high in the first step, which is context 0 for instance, the value '0' is recorded as the vertex information. The vertex information may be any information allowing a path to be reconstructed. Using values 642 as vertex information is beneficial, as the values 642 are simple and easy to implement, but any other suitable technique may be used.

In step 720, it is determined if the destination vertex is reached. If the destination vertex is reached, (step 720=YES), the method ends in step 750 when the shortest path is read out of the HAGAR circuit 600. An example of how the shortest path is read out is given below in reference to FIG. 8. Briefly, each of the values 642 in the registers 641 act as part of a linked list. If the destination vertex is vertex $v_{11}$, as an example, the value 642-12 in the register 641-12 might be 12. The 12 corresponds to the previous context (i.e., context 12), which in this example also corresponds to column 12. The value 642-13 in the register 641-13 may be read to yield another context. This process is continued until the source vertex is reached.

It should be noted that method 700 may also entail determining that no progress has been made. If no new vertices have been discovered, for example, then the method can also end. Additionally, a reachability analysis may be performed prior to a shortest path analyis.

If the destination vertex is not reached (step 720=NO), the method continues in step 725 when a candidate vertex is chosen from the current vertex group (e.g., current group 621). The context for the candidate vertex is loaded in step 730, which comprises for instance changing the RAM address 660 to a context corresponding to the candidate vertex. The candidate vertex is also used in current row number module 610 and row number module 610 activates the row of the HAGAR cell array 650. This also passes the candidate vertex to the register file 640, as the column corresponding to the candidate vertex will also be driven high and a corresponding one of the registers 641 will be high.

Vertex information is recorded in step 735. Vertex information comprises recording, generally in a register 641, during which context a column goes high. If the column has already been driven high, the first context entry recorded in register 641 is used and usually is not overwritten. Additionally, the candidate columns detection module 630 can pass high values for columns to the leading vertex detection module 620, which can store which columns are high in the next group 622 if the columns have not previously been examined.

In step 740, it is determined if there are additional vertices in the current vertex group. If so (step 740=YES), then another candidate vertex is selected in step 725. If not (step 740=NO), then distance is increased in step 745 and the current vertex group is determined in step 715. In step 715, the current vertex group 621 can be determined by making the next vertex group 622 become the current vertex group 621.

Figure 8:
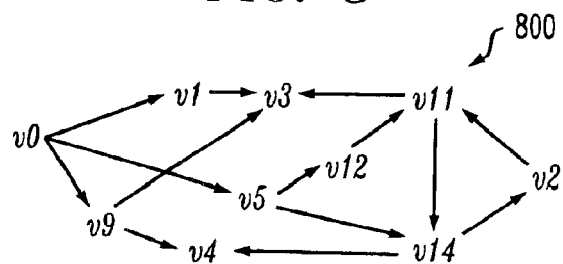
FIG. 8 is an example of a graph, used to illustrate the circuit of FIG. 6 and the method of FIG. 7.

Turning now to FIG. 8 with appropriate reference to FIGS. 6 and 7, an exemplary graph 800 is shown comprising vertices $v_0$, $v_1$, $v_2$, $v_3$, $v_5$, $v_9$, $v_{11}$, $v_{12}$, and $v_{14}$. Graph 800 is used as an example to illustrate how method 700 might be applied. The vertex $v_0$ is taken as the source vertex (step 710) and has edges to vertices $v_1$, $v_5$, and $v_9$. The vertex group $\{v_1, v_5, v_9\}$ is therefore determined during a first step (step 715). In step 720, it is determined that the destination vertex has not been reached. From the vertex $v_1$, the vertex $v_3$ may be reached through the appropriate edge (steps 725 through 735); from vertex $v_5$, the vertices $v_{12}$ and $v_{14}$ may be reached through the appropriate edges (step 740=YES and steps 725 through 735); from vertex $v_9$, the vertices $v_3$ and $v_4$ may be reached (step 740=YES and steps 725 through 735). Vertices $v_3$, $v_4$, $v_{12}$, and $v_{14}$ now form the group that needs to be checked in step two (step 740=NO, step 745, and step 715). This process continues until the destination vertex v11 is reached (step 720=YES), or no progress is made.

The registers 641 in each column record the context number, in values 642, as the column goes from '0' to '1' (step 735). Context numbers correspond to vertex numbers in the examples of FIGS. 6 and 7. In the present example, the registers 641 at columns 1, 5, and 9 (e.g., registers 641-2, 641-6 and 641-10, of which register 641-2 is shown in FIG. 6) record zero (i.e., for context zero) in values 642-2, 641-6 and 641-10 (of which value 642-2 is shown in FIG. 6), while the register 641 at column 3 (e.g., register 641-4, which is not shown in FIG. 6) records a one (i.e., for context one) in value 641-4 (not shown in FIG. 6) When the destination vertex is reached (step 720=YES), the shortest path is retrieved from the register file module 640 as follows. The recorded values 642 form a linked list. In the present example with destination vertex $v_{11}$, the value 642-12 (not shown in FIG. 6) of 12 is read from the register 642-12 (not shown in FIG. 6) at column 11. At column 12, the value 642-13 (not shown) of five is read out of the register 642-13 (not shown in FIG. 6). At column five, the value 646-6 (not shown in FIG. 6) of zero is read out. The zero value corresponds to the source vertex, and thus a shortest path is the following: $v_0$ to $v_5$ to $v_{12}$ to $v_{11}$.

In case of a cycle in the graph, or multiple paths to the same vertex, a technique can record the first time the vertex is reached. Any subsequent visit to the same vertex is ignored since this vertex cannot indicate a path shorter than the one through which the node was initially visited.

The techniques presented herein may be distributed among reconfigurable hardware and a microprocessor or may reside substantially completely in one or the other.

It is to be understood that the embodiments and variations shown and described herein are merely illustrative of the principles of this invention and that various modifications may be implemented by those skilled in the art without departing from the scope and spirit of the invention. For example, the columns of a adjacency matrix 160 may also be partitioned into contexts and the apparatus and methods herein modified in order to analyze adjacency matrices 160 having such additional contexts. Moreover, although implementation through FPGAs have been described herein, the present invention may be implemented through other means, such as being implemented via a computer system, a very large scale integrated (VLSI) circuit or a combination of a computer system and an FPGA. Other modifications, such as having an edge be indicated by a low value on a column instead of a high value on a column may be made. In addition, the various assumptions made herein are for the purposes of simplicity and clarity of illustration, and should not be construed as requirements of the present invention.

We claim:

1. A method for analyzing a graph comprising a plurality of vertices and a plurality of edges interconnecting selected ones of the vertices, comprising the steps of:

defining a plurality of hardware cells in a hardware array, wherein at least a given one of the plurality of hardware cells corresponds to sets of vertices, each of the sets from a corresponding one of a plurality of portions of the graph, and wherein the given hardware cell is adapted to select one of the plurality of sets of vertices and to define for the selected set of vertices whether an edge exists in the graph between the vertices in the selected set; and analyzing at least one property of the graph by using the plurality of hardware cells.

2. The method of claim 1, further comprising the steps of:

mapping the graph into an adjacency matrix comprising a plurality of elements, each element corresponding to a set of vertices of the graph and defining whether an edge exists between vertices in the set; and defining a plurality of contexts for the adjacency matrix, each of the plurality contexts comprising one or more of the plurality of elements, each of the plurality of contexts corresponding to a portion of the graph; and wherein each of the sets corresponding to the given hardware cell corresponds to a context.

3. The method of claim 2, further comprising the step of changing the context to a particular context, wherein the step of changing the context causes the given hardware cell to select one of the sets of vertices corresponding to the particular context.

4. The method of claim 2, wherein the step of analyzing further comprises the step of determining whether a vertex is reachable from a source vertex.

5. The method of claim 4, wherein the step of determining what vertices are reachable from a source vertex comprises the steps of:

selecting a source vertex;

switching at least the given hardware cell to a context corresponding to the source vertex;

determining which sets of vertices in the context have an edge interconnecting vertices in a set of vertices;

selecting one vertex from the sets of vertices in the context having an edge interconnecting vertices in a set of vertices;

switching at least the given hardware cell to a context corresponding to the one vertex;

performing the steps of determining which sets, selecting one vertex, and switching at least the given hardware cell to a context corresponding to the one vertex until all sets of vertices having an edge interconnecting vertices in a set of vertices have been selected, wherein any sets of vertices having an edge interconnecting vertices in the set indicate the vertices reachable from the source vertex.

6. The method of claim 2, wherein the step of analyzing further comprises the step of determining a shortest path from a source vertex to a destination vertex.

7. The method of claim 6, wherein the step of determining a shortest path further comprises the steps of:

selecting a source vertex;

switching at least the given hardware cell to a context corresponding to the source vertex;

determining a current vertex group, which comprises sets of vertices in the context having an edge interconnecting vertices in a set of vertices;

determining if a destination vertex has been reached by determining if the destination vertex is in the current vertex group;

when the destination vertex has not been reached:

selecting a candidate vertex from the current vertex group;

switching at least the given hardware cell to a context corresponding to the candidate vertex;

determining a next vertex group, which comprises sets of vertices in the context having an edge interconnecting vertices in a set of vertices;

recording vertex information for vertices in the next vertex group; and performing the steps of selecting a candidate vertex, switching at least the given hardware cell to a context corresponding to the candidate vertex, determining a next vertex group, and recording until all vertices in the current vertex group have been selected;

increasing a distance measure;

making the next vertex group be the current vertex group; and when the destination vertex has been reached, determining the shortest path by using the vertex information.

8. The method of claim 7, wherein the vertex information comprises a number for each of the sets of vertices having an edge interconnecting vertices in a set, and wherein the step of determining the shortest path by using the vertex information comprises the step of starting at the destination vertex and using the numbers as a linked list in order to determine each vertex in the shortest path.

9. The method of claim 1, wherein a set of vertices corresponding to the given hardware cell comprises a single vertex and another set of vertices corresponding to the given hardware cell comprises two vertices.

10. The method of claim 1, wherein at least the given hardware cell corresponds to a first and second interconnects, each first interconnect corresponding to one vertex from the graph and each second interconnect corresponding to another vertex in the graph, wherein the one vertex and the other vertex may or may not be the same vertex.

11. The method of claim 1, wherein the step of defining a plurality of hardware cells further comprises the step of defining the plurality of hardware cells on a gate array.

12. An apparatus for analyzing a graph comprising a plurality of vertices and a plurality of edges interconnecting selected ones of the vertices, comprising:

a plurality of hardware cells of a hardware array, wherein at least a given one of the plurality of hardware cells corresponds to sets of vertices, each of the sets from a corresponding one of a plurality of portions of the graph, and wherein the given hardware cell is adapted to select one of the plurality of sets of vertices and to define for the selected set of vertices whether an edge exists in the graph between the vertices in the selected set, wherein at least one property of the graph may be analyzed by using the plurality of hardware cells.

13. The apparatus of claim 12, wherein at least the given hardware cell comprises a device having a plurality of states and coupled to at least one memory element, wherein at least the given hardware cell is coupled to first and second interconnects, each of the first and second interconnects corresponding to a vertex from the graph, wherein each of the at least one memory elements selects one of the plurality of states of a hardware cell, wherein one state of a hardware cell couples the first and second interconnects, and wherein another state of a hardware cell decouples the first and second interconnects.

14. The apparatus of claim 13, wherein the device comprises a tri-state buffer.

15. The apparatus of claim 13, wherein each of the at least one memory elements for each of the given hardware cells comprises a plurality of memory elements adapted to be selected using an address, and wherein the apparatus further comprises:

a candidate columns detection module coupled to one or more of the first interconnects, the candidate columns detection module adapted to determine whether the one or more of the first interconnects is in a first state, the first state indicating that a set of vertices corresponding to a given hardware cell has an edge connecting vertices in the set, the candidate columns detection module coupled to a leading vertex detector module and also adapted to couple signals indicating which of the one or more of the first interconnects is in the first state to the leading vertex detector module;

the leading vertex detector module coupled to the signals from the candidate columns detection module and adapted to select candidate vertices corresponding to the one or more of the first interconnects and also adapted to determine and output an address in order to select a context corresponding to a selected candidate vertex; and a vertex inputs module coupled to the leading vertex detector module and one or more of the second interconnects, the vertex inputs module adapted to determine a selected candidate vertex from the leading vertex detector module and to drive a second interconnect corresponding to the selected candidate vertex to the first state.

16. The apparatus of claim 15, further comprising a signal output monitor adapted to output which first signals are the first state.

17. The apparatus of claim 13, wherein each of the at least one memory elements for each of the given hardware cells comprises a plurality of memory elements adapted to be selected using an address, and wherein the apparatus further comprises:

a candidate columns detection module coupled to one or more of the first interconnects, the candidate columns detection module adapted to determine whether the one or more of the first interconnects is in a first state, the first state indicating that a set of vertices corresponding to a given hardware cell has an edge connecting vertices in the set, the candidate columns detection module coupled to a leading vertex detector module and also adapted to couple signals indicating which of the one or more of the first interconnects is in the first state to the leading vertex detector module;

the leading vertex detector module coupled to the signals from the candidate columns detection module and adapted to select candidate vertices corresponding to the one or more of the first interconnects and also adapted to determine and output an address in order to select a context corresponding to a selected candidate vertex; and a current row number module coupled to the leading vertex detector module and one or more of the second interconnects, the vertex inputs module adapted to determine a selected candidate vertex from the leading vertex detector module and to drive a second interconnect corresponding to the selected candidate vertex to the first state.

18. The apparatus of claim 17, further comprising a register file module, the register file module having one or more registers, each register corresponding to a first interconnect, wherein the register file module is adapted to store a number in a register, the number corresponding to a context when a corresponding one of the first interconnect becomes the first value.

19. The apparatus of claim 18, wherein the register file is coupled to the address and is adapted to use the address to determine context.

20. An article of manufacture for analyzing a graph comprising a plurality of vertices and a plurality of edges interconnecting selected ones of the vertices, comprising:

a machine readable medium containing one or more programs which when executed implement the steps of:

defining a plurality of hardware cells, wherein at least a given one of the plurality of hardware cells corresponds to sets of vertices, each of the sets from a corresponding one of a plurality of portions of the graph, and wherein the given hardware cell is adapted to select one of the plurality of sets of vertices and to define for the selected set of vertices whether an edge exists in the graph between the vertices in the selected set; and analyzing at least one property of the graph by using the plurality of hardware cells.

* * * * *